United States Patent [19]
Kudo

[11] Patent Number: 5,300,971
[45] Date of Patent: Apr. 5, 1994

[54] PROJECTION EXPOSURE APPARATUS

[75] Inventor: Yuji Kudo, Kawasaki, Japan

[73] Assignee: Nikon Corporation, Tokyo, Japan

[21] Appl. No.: 8,547

[22] Filed: Jan. 25, 1993

[30] Foreign Application Priority Data

Feb. 17, 1992 [JP] Japan ................... 4-61127

[51] Int. Cl.⁵ .................. G03B 27/54; G03B 27/42
[52] U.S. Cl. ........................... 355/67; 355/53
[58] Field of Search .......... 355/43, 53, 67, 70, 355/69; 353/122; 362/268

[56] References Cited

U.S. PATENT DOCUMENTS

| | | | |
|---|---|---|---|
| 4,497,015 | 1/1985 | Konno et al. | 362/268 |
| 4,619,508 | 10/1986 | Shibuya et al. | 353/122 |
| 4,789,222 | 12/1988 | Ota et al. | 355/67 X |
| 4,851,978 | 7/1989 | Ichihara | 362/268 |
| 4,939,630 | 7/1990 | Kikuchi et al. | 362/268 |
| 4,970,546 | 11/1990 | Suzuki et al. | 355/53 |
| 4,988,188 | 1/1991 | Ohta | 353/122 |
| 5,097,291 | 3/1992 | Suzuki | 355/69 |
| 5,121,160 | 6/1992 | Sano et al. | 355/53 |
| 5,191,374 | 3/1993 | Hazama et al. | 355/43 |
| 5,237,367 | 8/1993 | Kudo | 355/67 |

FOREIGN PATENT DOCUMENTS 6250811 4/1982 Japan .

Primary Examiner—Richard A. Wintercorn
Attorney, Agent, or Firm—Shapiro and Shapiro

[57] ABSTRACT

A projection exposure apparatus is provided with a light source generating pulsed light, a rotary deflecting prism for deviating the light beam from the light source, fly's eye lenses for forming surface light sources in succession by thus deviated light beam, and a condenser lens for condensing the light from the fly's eye lens for illuminating the reticle. The pulsed light from the light source is alternately introduced into the fly's eye lenses by every pulse or by every plural number of pulses.

12 Claims, 9 Drawing Sheets

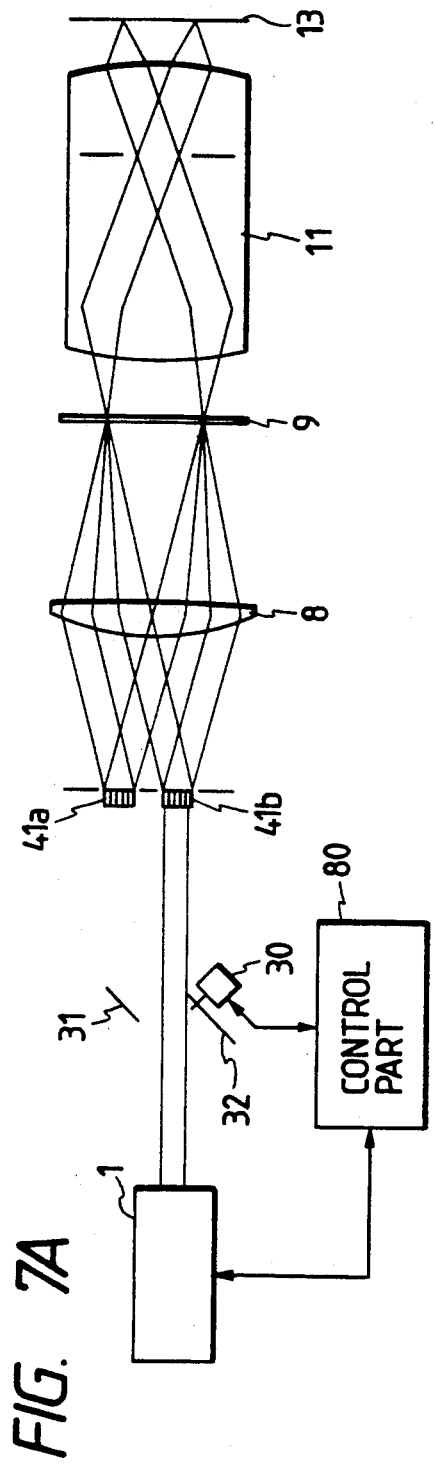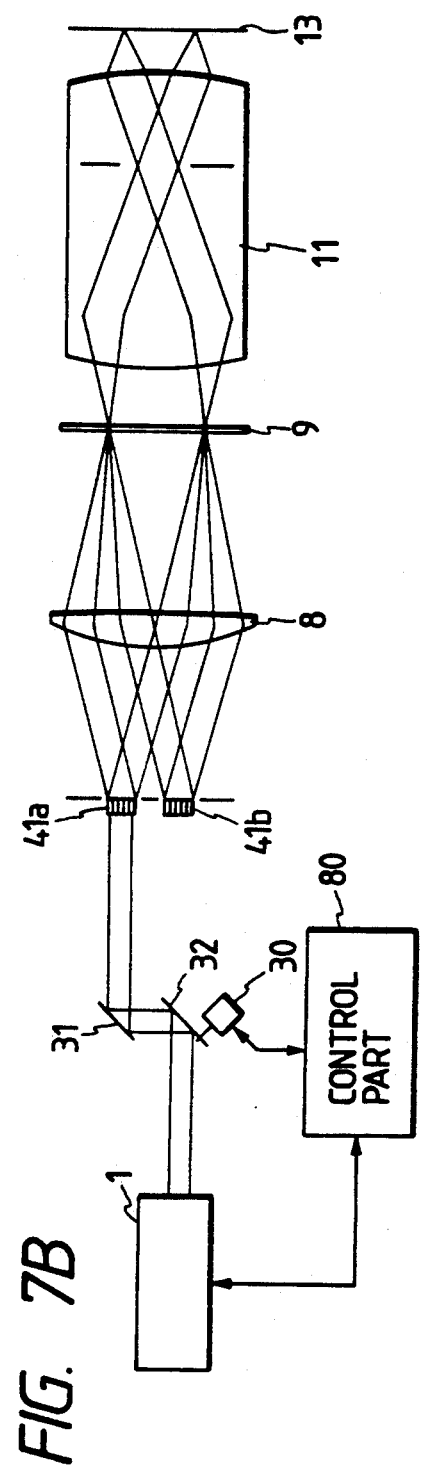

PROJECTION EXPOSURE APPARATUS

BACKGROUND OF THE INVENTION

1. Field of the Invention

The present invention relates to a projection exposure apparatus employed in the circuit pattern formation in semiconductor integrated circuits, liquid crystal devices and the like.

2. Related Background Art

The circuit pattern formation in the semiconductor devices or the like requires a step generally called photolithography. Said step generally consists of transferring a pattern of a reticle (mask) onto a substrate such as a semiconductor wafer. The substrate is coated with photosensitive photoresist, onto which the circuit pattern is transferred according to an irradiating light image, namely according to the pattern of transparent areas of the reticle. In a projection exposure apparatus (such as stepper), the image of the circuit pattern formed on the reticle is focused, by projection, onto the substrate (wafer) through a projection optical system.

In an optical system for illuminating the reticle, there is employed an optical integrator such as a fly's eye lens or optical fibers, in order to obtain uniform illuminating light intensity on the reticle. In case the fly's eye lens is employed for optimizing the uniformity of illumination, a relation of Fourrier transformation substantially stands between the focal plane at the reticle side (exit side) and the reticle plane (pattern bearing face), and such relation of Fourrier transformation stands also between the focal plane at the reticle side and the focal plane at the light source side (entrance side). Consequently, the pattern-bearing face of the reticle and the focal plane of the fly's eye lens at the light source side (more precisely the focal planes, at the light source side, of individual lenses of the fly's eye lens) are in an imaging (conjugate) relationship. Consequently, on the reticle, the illuminating lights from the optical elements (secondary light source images) of the fly's eye lens are mutually added (superposed) through a condenser lens or the like, thereby being averaged and providing improved uniformity of the illumination intensity on said reticle.

In the conventional projection exposure apparatus, the light amount distribution of the illuminating light beam, entering the entrance face of the optical integrator, such as the fly's eye lens mentioned above, is made substantially uniform in a substantially circular area (or a rectangular area) around the optical axis of the illuminating optical system.

FIG. 16 schematically shows the configuration of a conventional projection exposure apparatus (stepper) as explained above, wherein an illuminating light beam L140 illuminating a pattern 10 of a reticle 9, through a fly's eye lens 41c, a spatial filter (diaphragm) 5a and a condenser lens 8 in the illuminating optical system. Said spatial filter 5c is positioned at a focal plane 414c of the fly's eye lens 41c at the reticle side, namely a Fourrier transformation plane 17 for the reticle pattern 10 (hereinafter called pupil plane) or in the vicinity thereof, and is provided with a substantially circular aperture with the center at the optical axis AX of a projection optical system 11, in order to limit the secondary light source image (surface light source image), formed on the pupil plane, into a circular area. The illuminating light beam, thus transmitted by the pattern 10 of the reticle 9, is focused by the projection optical system 11 onto a photoresist layer on a wafer 13. In this configuration, the ratio of the numerical aperture of the illuminating optical system (41c, 5a, 8) to that of the projection optical system 11 at the reticle side, or so-called $\sigma$-value, is determined by the diaphragm (for example by the aperture of the spatial filter 5a) and is generally selected within a range of 0.3 to 0.6.

The illuminating light beam L140 is diffracted by the pattern 10 formed on the reticle 9, thus generating a 0th-order diffracted light $D_0$, a 1st-order diffracted light $D_p$ and a $-$1st-order diffracted light $D_m$. Said diffracted lights ($D_0$, $D_m$, $D_p$) are condensed by the projection optical system 11, thereby generating interference fringes on the wafer 13. Said interference fringes constitute the image of the pattern 10. In this state, the angle $\theta$ at the reticle side between the 0th-order diffracted light $D_0$ and the $\pm$1st-order diffracted lights $D_p$, $D_m$ is given by a relation $\sin\theta = \lambda/P$ wherein $\theta$ is the wavelength of the exposing light, and P is the pitch of the pattern.

As the pattern pitch becomes finer, $\sin\theta$ becomes larger, and, when it exceeds the numerical aperture $NA_R$ at the reticle side of the projection optical system 11, the $\pm$1st-order diffracted lights $D_p$, $D_m$ are limited by the effective diameter of the pupil (Fourrier transformation plane) 12 in the projection optical system 11 and become unable to pass through said projection optical system. In such state the wafer 13 receives the 0th-order diffracted light $D_0$ only, and the interference fringes are not formed thereon. Thus, in case of $\sin\theta > NA_R$, there cannot be obtained the image of the pattern 10, so that the pattern 10 cannot be transferred onto the wafer 13.

Based on these facts, the pitch P satisfying the relation $\sin\theta = \lambda/P \approx NA_R$ has been given, in the conventional projection exposure apparatus, by the following equation:

$$P \approx \lambda/NA_R \tag{1}$$

Since the minimum pattern size is equal to a half of the pitch P, it is about $0.5 \times \lambda/NA_R$, but, in the practical photolithographic process, there is required a certain depth of focus in order to cope with the curvature of the wafer, topography on the wafer resulting from the process, or the thickness of the photoresist itself. For this reason the minimum resolvable pattern size in the practical process is represented as $k \cdot \lambda/NA_R$, wherein k is called process coefficient and is generally in a range of 0.6 to 0.8. As the ratio of the numerical aperture $NA_R$ at the reticle side to the numerical aperture $NA_W$ at the wafer side is equal to the imaging magnification of the projection optical system, the minimum resolvable pattern size on the reticle is represented by $k \cdot \lambda/NA_R$ while the minimum resolvable pattern size on the wafer is represented by $k \cdot \lambda/NA_W = k \cdot \lambda/B \cdot NA_R$, wherein B is the imaging magnification (reduction ratio).

Consequently, for transferring a finer pattern, it has been considered necessary to employ the exposure light source of a shorter wavelength or to adopt the projection optical system of a larger numerical aperture. It is naturally conceivable to optimize both the exposure wavelength and the numerical aperture.

However, in the conventional projection exposure apparatus as explained above, the use of an illumination light source of a shorter wavelength is presently considered difficult, for example because of absence of suitable material adapted for use as transmissive optical members. Also the numerical aperture of the projection optical system is already close to the theoretical light, so that a further increase is almost unexpectable. Besides, even if a further increased numerical aperture is achievable, the depth of focus represented by $\pm\lambda/2NA^2$ rapidly decreases with the increase of the numerical aperture, so that the deficiency in the practically required depth of focus becomes conspicuous.

On the other hand, so-called phase shift reticle, in which the phase of the light transmitted by particular portions of the transparent circuit patterns of the reticle is shifted by $\pi$ with respect to the transmitted from other portions, is proposed for example in the Japanese Patent Publication No. 62-50811, and such phase shift reticle enables transfer of the patterns finer than in the prior art.

However such phase shift reticle still has various problems, as it is expensive because of the complex manufacturing process, and as the methods for inspection and for repair have not been established.

Therefore, in the projection exposure technology without the phase shift reticle, attempts are being made to improve the resolution of pattern transfer through an improvement in the illuminating method for reticle. One of such illuminating methods consists of providing the spatial filter 5a shown in FIG. 16 with an annular aperture, in order to cut off the illuminating light beam present around the optical axis of the illuminating optical system on the Fourrier transformation plane 17, thereby giving a certain inclination to the illuminating light beam reaching the reticle 9.

However, such special illuminating method, as employing the annular distribution of the illuminating light beam in the Fourrier transformation plane of the illuminating optical system, certainly realizes an improvement in the resolution even with an ordinary reticle, but is associated with a drawback of difficulty of securing uniform illumination intensity over the entire reticle. Also a system provided merely with a member for partially cutting off the illuminating light beam, such as the spatial filter as shown in FIG. 16, naturally results in a significant loss of the illumination intensity on the reticle or on the wafer, thus leading to another problem of increased exposure time, resulting from the lowered illumination efficiency. Furthermore, the Fourrier transformation plane in the illuminating optical system, where the light beam from the light source is concentrated, shows significant temperature increase by the light absorption by the light intercepting member such as the spatial filter, and suitable measure, such as air cooling, has to be considered against the deterioration in performance resulting from thermal variation in the illuminating optical system.

SUMMARY OF THE INVENTION

In consideration of the foregoing, the object of the present invention is to provide a projection exposure apparatus which is capable of providing a high resolution and a large depth of focus even in combination with an ordinary reticle, and is excellent in uniformity and efficiency of illumination.

The above-mentioned object can be attained, according to an aspect of the present invention, by a projection exposure apparatus comprising an illuminating optical system for illuminating a mask bearing a predetermined pattern; and a projection optical system for forming the image of the pattern, illuminated by said illuminating optical system, on a photosensitive substrate; said illuminating optical system including light source means emitted pulsed light, surface light source forming means for forming a surface light source by the pulsed light from said light source means; a condensing optical system for illuminating the mask by condensing the light from said surface light source forming means; and deviation means positioned in the light path between said light source means and said surface light source forming means and adapted to deviate the pulsed light from the light source means;

wherein said deviation means is adapted to deviate the pulsed light, by every pulse or by every plural number of pulses, to plural positions of the surface light source forming means, deviated from the optical axis of the illuminating optical system; and said surface light source forming means is adapted to form plural surface light source which are substantially separated one another and deviated from the optical axis.

In the above-explained configuration, the pulsed light from the light source means enters, by every pulse or by every plural number of pulses, the plural positions of the surface light source forming means, deviated from the optical axis of the illuminating light system. By means of said pulsed light, the surface light source forming means forms plural surface (secondary) light sources which are separated each other and are deviated from the optical axis. Consequently there can be provided a projection exposure apparatus which provides a higher resolution and a larger depth of focus than in the prior art and which is excellent in the uniformity and efficiency of illumination, even in combination with a reticle bearing ordinary translucent and opaque patterns as the mask. Also there is provided an advantage of reduced loss of the pulsed light by the intermediate optical systems, since the pulsed light from the light source means is guided, by every pulse or by every plural number of pulses, to plural positions of the surface light source forming means.

Also in an aspect of the present invention, the surface light source forming means of the projection exposure apparatus may include plural optical integrators, provided in deviated positions from the optical axis of the illuminating optical system. In this case there is obtained an advantage of easier manufacture of the optical integrators, in comparison with the case of using different portions of an optical integrator in succession.

The functions of the present invention will be explained in the following, with reference to FIG. 15. For the case of explanation, it is assumed that the surface light source forming means is composed of two fly's eye lenses 41a, 41b, that the deviating means is composed of a rotating deflection prism 40, and that the projection optical system 11 is to transfer the image of a reticle pattern 10 of a reticle 9 onto a wafer 13. Referring to FIG. 15, the substantially separated plural secondary (surface) light sources of the present invention are formed at the exit faces of the fly's eye lenses 41a, 41b or the vicinity thereof. The light beam from the light source is deviated by a prism 40 rotating about the optical axis, in such a manner that it illuminates the fly's eye lenses 41a and 41b alternately, at every pulse or every plural number of pulses. The centers of the fly's eye lenses 41a, 41b are separate from the optical axis AX, and the formed secondary light sources 414a, 414b substantially coincide with the Fourrier transformation plane 17 of the reticle pattern 10. Consequently the incident angle of the light beams emerging from said fly's eye lenses into the reticle 9 is determined by the distance of the fly's eye lenses 41a, 41b to the optica axis AX.

The reticle pattern 10 formed on the reticle (mask) 9 generally contains periodic patterns, particularly in case of circuit patterns. Consequently the reticle pattern 10, illuminated by a fly's eye lens 41a, generate a 0th-order diffracted light component $D_0$, +1st-order diffracted light components $D_p$, $D_m$ and higher-order diffracted light components, in a direction corresponding to the geometry of the pattern.

In this state, since the illuminating light beam (principal ray) is inclined with respect to the reticle 9, the various diffracted light components are also generated with inclination (angular difference), in comparison with the case of perpendicular illumination. In FIG. 15, the illuminating light beam L130 enters the reticle 9 with an inclination $\psi$.

Said illuminating light beam L130 is diffracted by the reticle pattern 10, thus generating a 0th-order diffracted light $D_0$ proceeding with an inclination $\psi$ with respect to the optical axis AX, a +1st-order diffracted light $D_p$ inclined by $\theta_p$ with respect to the 0th-order diffracted light, and a −1st-order diffracted light $D_m$ inclined by $\theta_m$ with respect to the 0th-order diffracted light $D_0$. If the projection optical system is telecentric on both sides, the illuminating light beam L130 enters the reticle pattern 10 with an inclination $\psi$ with respect to the optical axis AX of the projection optical system 11, so that 0th-order diffracted light $D_0$ becomes also inclined by an angle $\psi$ with respect to the optical axis AX of the projection optical system.

Consequently the +1st-order diffracted light $D_p$ proceeds in a direction $(\theta_p+\psi)$ with respect to the optical axis AX, and the −1st-order diffracted light $D_m$ proceeds in a direction $(\theta_m-\psi)$ with respect to the optical axis AX.

The diffraction angles $\theta_p$, $\theta_m$ are given by:

$$\sin(\theta_p+\psi)-\sin\psi=\lambda/P \qquad (2)$$

$$\sin(\theta_m+\psi)+\sin\psi=\lambda/P \qquad (3)$$

It is assumed that both the +1st-order diffracted light $D_p$ and the −1st-order diffracted light $D_m$ pass through the pupil 12 of the projection optical system 11.

As the reticle pattern 10 becomes finer, the diffraction angle increases so that the +1st-order diffracted light $D_p$, proceeding in the direction $(\theta_p+\psi)$, becomes unable to pass through the pupil 12 of the projection optical system 11, because of a relation $\sin(\theta_p+\psi)>NA_R$. However, because the illuminating light beam L130 is inclined with respect to the optical axis AX, the −1st-order diffracted light $D_m$ can still pass through the projection optical system 11. In other words, there will stands a relation $\sin(\theta_m-\psi)<NA_R$.

Consequently, on the wafer 13, there are formed interference fringes by the 0th-order diffracted light $D_0$ and the −1st-order diffracted light $D_m$. Said interference fringes constitute the image of the reticle pattern 10, and, when the reticle pattern 10 is a 1:1 line-and-space pattern, there can be obtained a contrast of about 90%, whereby the image of the reticle pattern 10 can be patterend on the photoresist coated on the wafer 13.

The limit of resolution in this state is reached when a condition:

$$\sin(\theta_m-\psi)=NA_R \qquad (4)$$

stands. Consequently, the minimum transferrable pattern pitch on the reticle is given by:

$$NA_R+\sin\psi=\lambda/P$$

$$P=\lambda/(NA_R+\sin\psi) \qquad (5)$$

As an example, if $\sin\psi$ is selected as about $0.5\times NA_R$, the minimum transferrable pattern pitch on the reticle is given by:

$$P=\lambda/(NA_R+0.5\ NA_R)=2\lambda/3NA_R \qquad (6)$$

On the other hand, in the conventional exposure apparatus in which the illuminating light is distributed, on the pupil 17, circularly about the optical axis AX as shown in FIG. 16, the resolution limit is $P\approx\lambda/NA_R$ as indicated in the equation (1). It will therefore be understood that a higher resolution than in the conventional exposure apparatus can be attained.

It will then be explained why the depth of focus also becomes larger by irradiating the reticle pattern with the exposing light beam of particular incident direction and angle and forming the pattern by means of the 0th- and 1st-order diffracted lights on the wafer.

When the wafer 13 is at the focal position (best image plane) of the projection optical system 11 as shown in FIG. 15, the diffracted lights from a point in the reticle pattern 10 to a point on the wafer 13 have a same optical path length, regardless of the passing portion in the projection optical system 11. Thus, even when the 0th-order diffracted light component passes the approximate center (near the optical axis) of the pupil plane 12 of the projection optical system 11 as in the conventional configuration, the 0th-order diffracted light and other diffracted light components have a same optical path length, with no mutual difference in wavelength. However, in a defocus state in which the wafer 13 does not coincide with the focal position of the projection optical system 11, the optical path length of the obliquely entering higher-order diffracted light becomes shorter in front of the focal point (farther from the projection optical system 11) or longer behind the focal point (closer to the projection optical system 11), with respect to the 0th-order diffracted light passing the vicinity of the optical axis, and the difference in the optical path length is related with the incident angle. Consequently the diffracted lights of 0th-order, 1st-order, . . . mutually form a wave front aberration, thus generating image blurs in front of and behind the focal position.

The above-mentioned wave front aberration by defocus is given by $\Delta F r^2/2$, wherein $\Delta F$ is the amount of aberration of the wafer 13 from the focal position, and r is the sine of the incident angle $\theta w$ of each diffracted light into a point on the wafer ($r=\sin\theta w$). In this equation, r indicates the distance of each diffracted light from the optical axis AX on the pupil plane 12. In the conventional projection exposure apparatus shown in FIG. 11, r (0th-order)=0 because the 0th-order diffracted light $D_0$ passes the vicinity of the optical axis AX, while r (1st-order)=$M\lambda/P$ stands for the ±1st-order diffracted lights $D_p$, $D_m$, wherein M is the magnification of the projection optical system. Consequently the wave front aberration by defocus between the 0th-order diffracted light $D_0$ and the ±1st-order diffracted lights $D_p$, $D_m$ can be represented by:

$\Delta F \cdot M^2 (\lambda/P)^2 / 2$.

On the other hand, in the projection exposure apparatus of the present invention, since the 0th-order diffracted light $D_0$ is generated in a direction inclined by $\psi$ from the optical axis AX as shown in FIG. 15, the distance of the 0th-order diffracted light from the optical axis AX on the pupil plane 12 is given by r (0th-order) = $M \cdot \sin\psi$.

Also the distance of the $-1$st-order diffracted light from the optical axis on the pupil plane is given by r $(-1\text{st-order}) = M \cdot \sin(\theta_m - \psi)$. If a condition $\sin\psi = \sin(\theta_m - \psi)$ is satisfied, the relative wave front aberration of the 0th-order diffracted light $D_0$ and the $-1$st-order diffracted light $D_m$ resulting from defocus becomes zero, so that the image blur of the reticle pattern 10 does not become so large as in the conventional configuration even when the wafer 13 is somewhat aberrated axially from the focal position. Stated differently, the depth of focus becomes larger. Also, since $\sin(\theta_m - \psi) + \sin = \lambda/P$ as shown in the equation (3), the depth of focus can be made extremely large by selecting the incident angle $\psi$ of the illuminating light beam L130 into the reticle 9, with respect to the pattern pitch P, so as to satisfy a relation $\sin\psi = \lambda/2P$.

Also in the present invention, since the pulsed illuminating light beam from the light source is guided in turn, by every pulse or by every plural number of pulses, to the fly's eye lenses 41a, 41b, the light from the light source can be utilized with only limited loss of the light amount, in realizing the projection exposure system of a high resolution and a large depth of focus as explained above. Furthermore, in an aspect of the present invention, a higher resolution or a higher level of integration may be achieved with the projection exposure apparatus already working in the manufacturing line of semiconductor devices, by merely replacing the illuminating optical system and still utilizing the conventional projection optical system.

Other objects of the present invention, and the features and advantages thereof, will become fully apparent from the following detailed description which is to be taken in conjunction with the attached drawings.

BRIEF DESCRIPTION OF THE DRAWINGS

FIG. 7A is a schematic view of an embodiment employing a movable mirror and a fixed mirror as the deviation means, in a state in which the light beam is introduced into a fly's eye lens;

FIG. 7B is a schematic view of an embodiment employing a movable mirror and a fixed mirror as the deviation means, in a state in which the light beam is introduced into the other fly's eye lens;

DETAILED DESCRIPTION OF THE PREFERRED EMBODIMENTS

Now the present invention will be clarified in detail by preferred embodiments thereof, shown in the attached drawings.

Figures 1, 2:
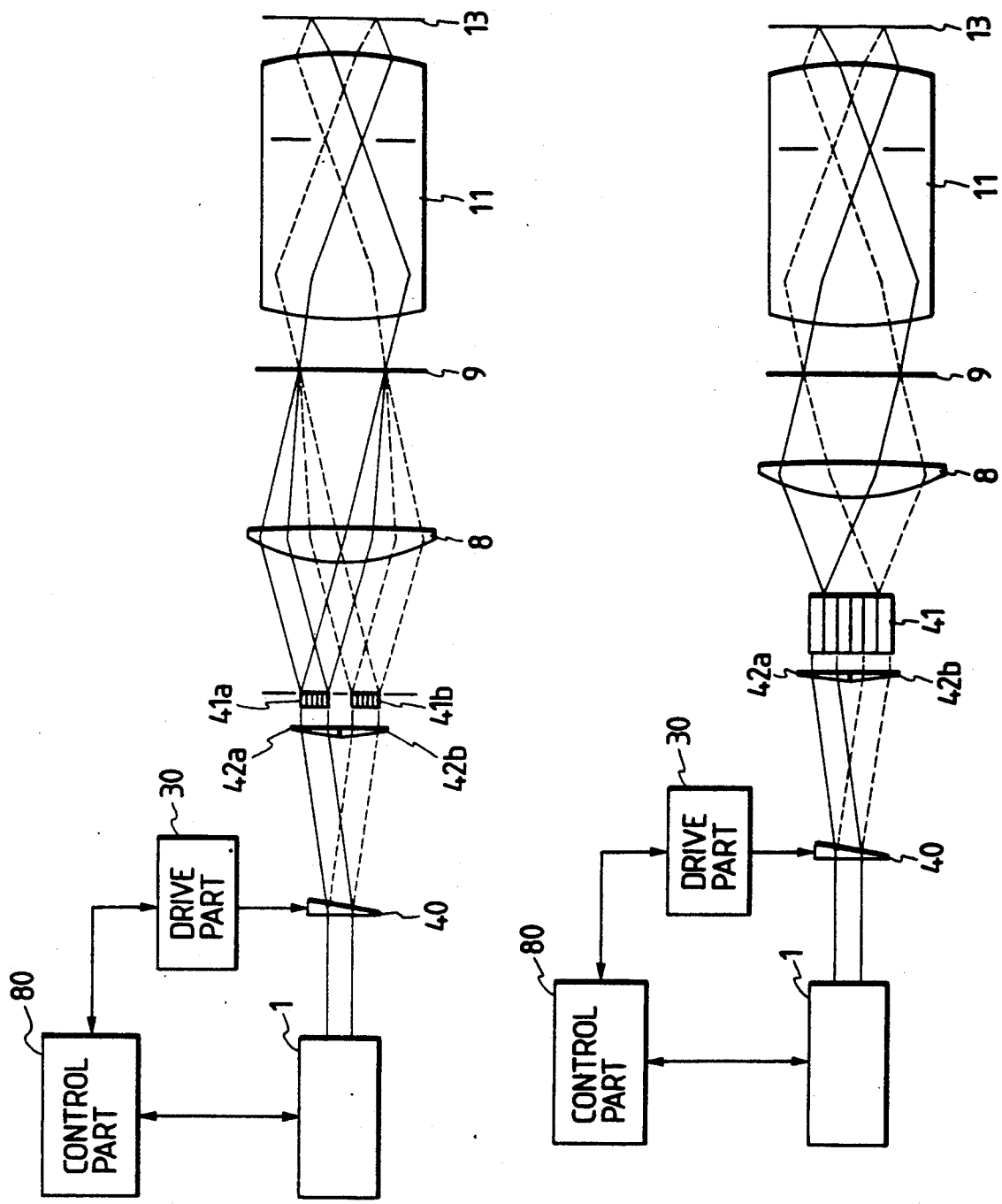
FIG. 1 is a schematic view of an embodiment of the projection exposure apparatus of the present invention.
FIG. 2 is a schematic view of an embodiment, in which plural fly's eye lenses shown in FIG. 1 are replaced by a fly's eye lens.

FIG. 1 is a schematic view of an embodiment of the projection exposure apparatus of the present invention, wherein a light source 1 is adapted to emit pulsed laser beam, and can be composed, for example, of a pulsed KrF excimer laser. The light beam (laser beam) emitted from the light source 1 is deflected by a deflecting prism 40, which is a wedge-shaped optical element, rendered rotatable about the optical axis of the illuminating optical system. The deflecting prism 40 is rotated by a driving unit 30, and the deflecting direction (emerging direction of the laser beam from the prism 40) varies with said rotation. Though not illustrated, the deflecting prism 40 is provided with a position detector such as an encoder, in order to transmit the rotating angle of said prism 40 to a control unit 80, which in response controls the driving operation of the driving unit 30 and the light emission of the light source 1. More specifically, based on the signal from the unrepresented position detector, the control unit 80 controls the light source 1 in such a manner that a pulsed light is emitted at the moment when the deflecting prism 40 reaches a desired deflecting direction. Thus either of fly's eye lenses 41a, 41b provided in positions separate from the optical axis of the illuminating optical system, substantially symmetrically with respect to said optical axis, can be illuminated by the laser beam.

In a state shown in FIG. 1, the light beam is deflected by the rotating deflecting prism 40, then deflected by a same angle toward the axial direction by a fixed deflecting prism 42a, and perpendicularly enters the fly's eye lens 41a. If a pulse is emitted from the light source 1 at this moment, the fly's eye lens 41a is illuminated by the laser beam as indicated by solid lines in FIG. 1. The light from a secondary light source, formed by said fly's eye lens 41a, is converted by a condenser lens 8 into a substantially parallel light beam, which illuminates a reticle 9 with a substantially uniform illumination intensity, with an oblique angle corresponding to the amount of eccentricity of the fly's eye lens 41a. The image of the pattern of said reticle 9 is transferred, through a projection optical system 11, onto a photoresist layer on a wafer 13.

Then, if the pulsed light is emitted from the light source 1 after a rotation of 180° of the deflecting prism 40, the laser beam is at first deflected in the opposite direction by the deflecting prism 40, then deflected by a same angle toward the axial direction by the other fixed deflecting prism 42b and enters perpendicularly a fly's eye lens 41b, as indicated by broken lines. Also the light from a secondary light source, formed by said fly's eye lens 41b, is converted by the condenser lens 8 into a substantially parallel light beam which illuminates the reticle 9 with a substantially uniform illumination intensity. Thus the image of the pattern of said reticle 9 is transferred by the projection optical system 11 onto the photoresist layer on the wafer 13.

Such alternate illumination of the fly's eye lenses 41a, 41b with the laser beam by emissions of the light source 1 in synchronization of the rotation of the deflecting prism 40 is equivalent, in average in time, to the illumination of the reticle 9 with two fly's eye lenses 41a and 41b.

Thus the illuminating light from two secondary light sources, formed on the exit faces of the fly's eye lenses 41a, 41b, illuminates the reticle 9 in the state of Koehler illumination, through the condenser lens 8.

In the present embodiment, since two fly's eye lenses 41a, 41b are illuminated alternately, there can be eliminated the influence of coherence, even in case of a laser light source of a high coherent.

Also in the present embodiment, the control unit 80 controls the pulsed light emission of the light source 1 according to the rotation of the deflecting prism 40, but the control unit 80 may be so designed as to control the rotation of the deflecting prism 40 according to the repeating cycle of the pulsed light emission of the light source 1.

FIG. 2 illustrates an embodiment in which the fly's eye lenses 41a, 41b, constituting the surface light source forming means in the embodiment shown in FIG. 1, are united into a fly's eye lens 41. In the configuration shown in FIG. 2, in response to the rotation of the deflecting prism 40 by the driving unit 30, the laser beam emerging from said prism 40 enters, through fixed prisms 42a, 42b, different areas of the fly's eye lens 41, whereby, at the exit side thereof, there are alternately formed secondary light sources in positions deviated from the optical axis of the illuminating optical system, according to the cycles of the pulsed light emitted from the light source 1. The lights from said secondary light sources obliquely illuminate the reticle 9 through the condenser lens 8.

Figure 8A:
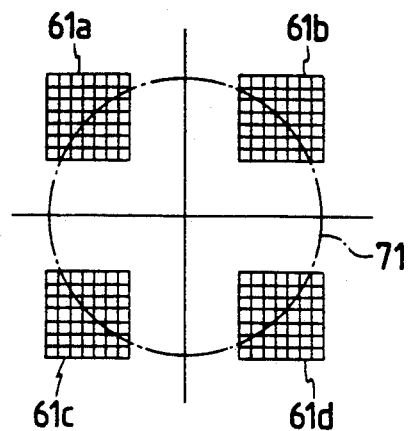
FIGS. 8A and 8B are plane views showing arrangements of four fly's eye lenses.

In the following there will be explained an embodiment with four fly's eye lenses, with reference to FIGS. 8A and 8B, which are plane views of fly's eye lenses seen from the side of the light source 1. When the fly's eye lenses 61a-61d are arranged as shown in FIG. 8A and if the light source 1 emits continuous light, the center of the deflected light moves on a circle 71 by the rotation of the deflecting prism 40. In the present embodiment, there is employed a pulsed light source which is activated in a position corresponding to each fly's eye lens, whereby four light source are formed by four pulses per rotation of the deflecting prism 40. Naturally the light emission of the light source may be so controlled as to illuminate a part of four fly's eye lenses, instead of all four lenses. Also the movement to next fly's eye lenses need not take place at every pulsed light but at every two or three pulses.

Figure 8B:
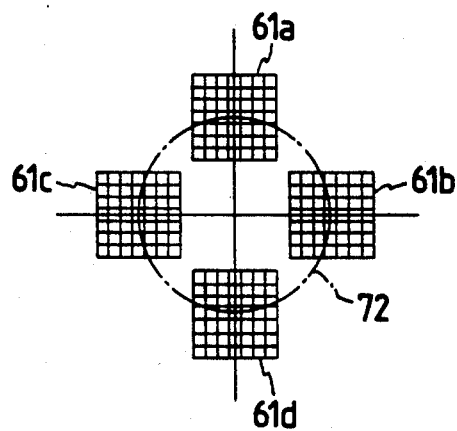

FIG. 8B illustrates an embodiment with a reduced distance among the fly's eye lenses 61a-61d, with a smaller circle 72, passing the centers of said fly's eye lenses, than the circle 71 in FIG. 8A, and with an arrangement of the fly's eye lenses, by 45° with respect to that shown in FIG. 8A. Such varied size of the circle and varied arrangement of the fly's eye lenses can be coped with a variation in the deflecting angle by the deflecting prism 40 and in the timing of pulsed light emission of the light source 1.

Figure 9:
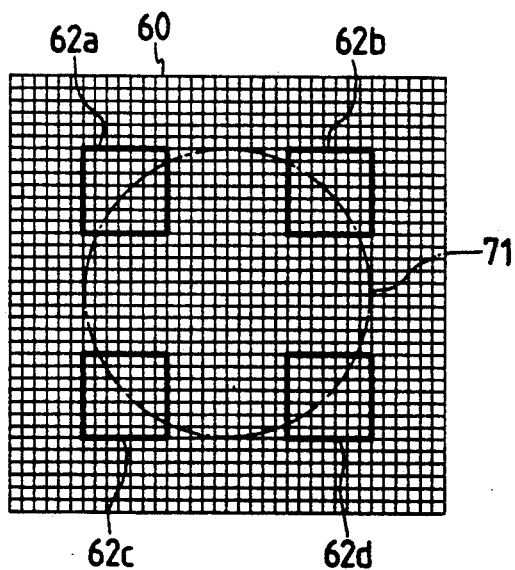
FIG. 9 is a plane view showing the position of surface light source formation by a fly's eye

Also FIG. 9 illustrates a configuration equivalent to those in the embodiments shown in FIGS. 8A and 8B, wherein the fly's eye lenses 61a-61d are replaced by a large fly's eye lens 60. In this case the deflecting prism 40 illuminates framed rectangular areas 62a, 62b, 62c and 62d in succession with the laser beam, whereby obtained are the effects same as those in the embodiment shown in FIG. 8A. Also there can be obtained effects equivalent to those in the embodiment shown in FIG. 8B, by adjustments in the deflection angle of the reflecting prism 40 and in the timing of pulsed light emission of the light source 1.

Figure 10A:
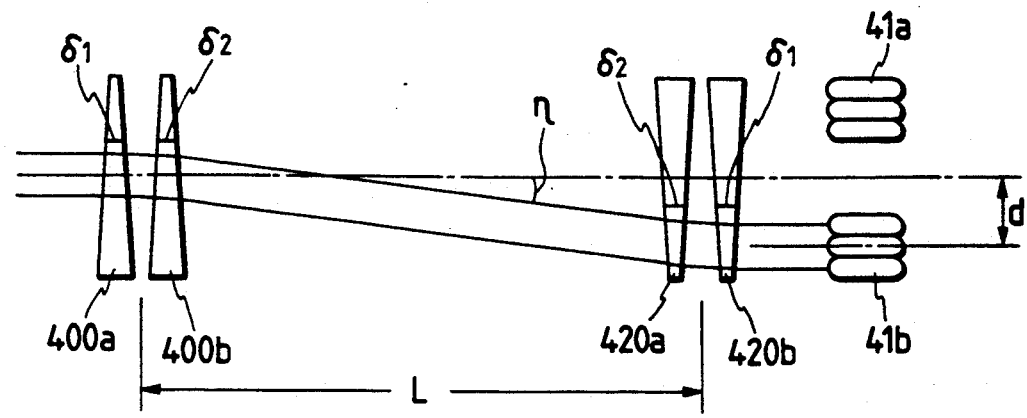
FIG. 10A is a view showing the principal part of an embodiment employing deflecting prisms with variable deflecting angle.

Furthermore, in order to cope with any arbitrary arrangement of the fly's eye lenses, the deflecting prism 40 may be replaced, as shown in FIG. 10A, by two deflecting prisms 400a, 400b which are rendered mutually rotatable about the optical axis. Such relative rotation can render the deflecting angle $\eta$ for the laser beam variable. In such case, the deflecting prisms 42a, 42b at the side of the fly's eye lenses 41a, 41b shown in FIG. 1 is replaced by two deflecting prisms 420a, 420b in order to render the deflecting angle variable, and the mutual rotational angle between the deflecting prisms 420a and 420b is so determined that the synthesized deflection angle of the prisms 420a, 420b cancels the synthesized deflection angle of the deflection prisms 400a and 400b. The laser beam is introduced, in succession, into different fly's eye lenses, by integral rotation of the paired deflecting prisms 400a, 400b and another paired deflecting prisms 420a, 420b about the optical axis, with a fixed mutual rotational angle.

Figure 10B:
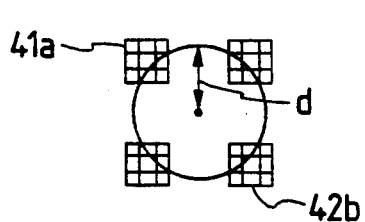
FIG. 10B is a plane view showing the arrangement of the fly's eye lenses in the embodiment shown in FIG. 10A.

In the following there will be given a numerical analysis on the configuration shown in FIG. 10A. It is assumed that the deflecting prisms 400a, 400b at the light source side respectively have vertical angles $\delta 1$, $\delta 2$ and refractive index n1, n2, while the deflecting prisms 420a, 420b at the side of the fly's eye lens have vertical angles $\delta 2$, $\delta 1$ and refractive indexes n2, n1. It is further assumed that the deflection center of the prisms 400a, 400b and that of the prisms 420a, 420b are axially distanced by L, and that the optical axis of the laser beam entering the fly's eye lens 41a or 41b is distanced by d from the optical axis of the illuminating optical system. As shown in FIG. 10B, said distance d is preferably equal to the distance from the centers of the fly's eye lenses 41a, 41b to the optical axis of the illuminating optical system.

Figure 10C:
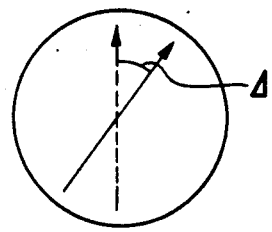
FIG. 10C is a view showing relative rotation of two deflecting prisms in the embodiment shown in FIG. 10A.

The deflection angle η for the laser beam can be varied by a relative rotation of the deflecting prisms 400a and 400b of the light source side as shown in FIG. 10C, and the laser beam can be supplied to the fly's eye lens in parallel manner to the optical axis of the illuminating optical system, by a relative rotation, by the same angle, of the prisms 420a and 420b at the fly's eye lens side. For a mutual rotation angle Δ between the deflecting prisms 400a and 400b, the distance d between the laser beam and the optical axis of the illuminating optical system can be given by:

$$d = L\{\phi 1^2 + \phi 2^2 - 2\phi 1.\phi 2.\cos(\pi - \Delta)\}^{\frac{1}{2}}$$

wherein $\phi 1 = \delta 1(n1-1)$, $\phi 2 = \delta 2(n2-1)$.

Consequently, in case for example the distance of the fly's eye lenses 41b, 41a is varied, the distance of the laser beam entering said fly's eye lenses from the optical axis of the illuminating optical system can be accordingly varied by a change in the relative rotational angle Δ.

Also in case the fly's eye lenses 41a, 41b are replaced by a large fly's eye lens 41 as shown in FIG. 2, there can be varied the distance d of the laser beam, entering said fly's eye lens 41, from the optical axis of the illuminating optical system. It is therefore possible to vary the incident angle of the laser beam obliquely illuminating the reticle, according to the pitch of the pattern thereon.

In the configuration shown in FIG. 10A, each of the fly's eye lenses is naturally provided with a position detector such as an encoder, for detecting the rotation angle.

Figure 3:
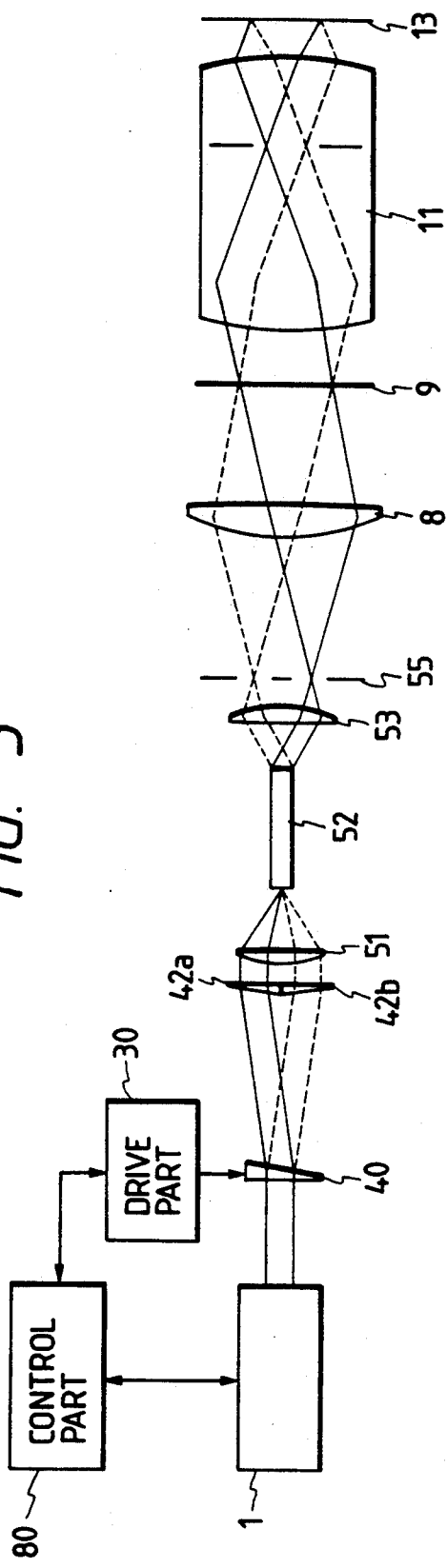
FIG. 3 is a schematic view of an embodiment employing a rod-shaped integrator as the surface light source forming means.

FIG. 3 illustrates an embodiment employing a rod-shaped integrator, instead of the fly's eye lenses, as the optical integrator.

In the configuration shown in FIG. 3, the light beam from the light source 1 is deflected by the rotary deflecting prism 40, and then is directed parallel to the optical axis of the illuminating optical system by the deflecting prism 42a or 42b. After emerging from said prism, the light beam is obliquely concentrated, by a condenser lens 51, to the vicinity of the entrance face of a rod-shaped integrator 52, then enters the interior thereof and repeats reflections therein, thus uniformly illuminating the exit face of said integrator 52. The angle of the emerging light from said integrator 52 corresponds to that of the incident light thereto. The light from the exit face of the rod-shaped integrator 52 is condensed by a lens 53, thus forming two separate secondary light sources on a plane 55. Said secondary light sources are substantially equivalent to the two light sources formed on the exit face of the fly's eye lens 41 shown in FIG. 2.

Figure 4:
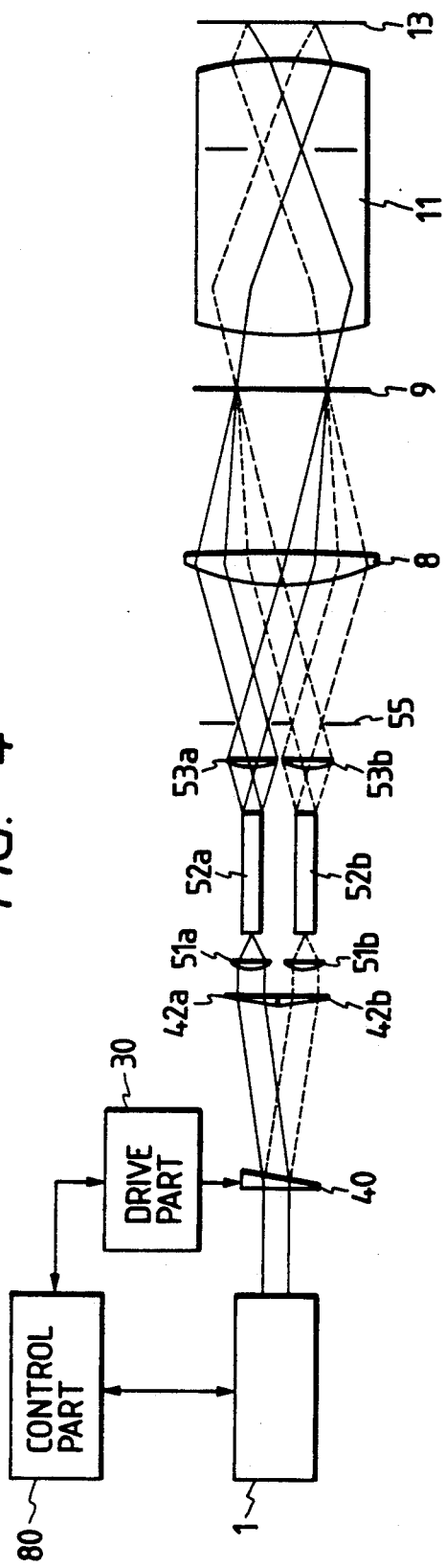
FIG. 4 is a schematic view of an embodiment employing plural rod-shaped integrators as the surface light source forming means.

FIG. 4 illustrates an embodiment in which the fly's eye lenses 41a, 41b in FIG. 1 are replaced by rod-shaped integrators. In this embodiment, the light beam deflected at first by the rotary deflecting prism 40 is shifted to a parallel state to the optical axis of the illuminating optical system by a deflecting prism 42a, then condensed by a condenser lens 51a to the vicinity of the entrance face of a rod-shaped integrator 52a and enters the interior thereof, thus repeating internal reflections and illuminating uniformly the exit face of said rod-shaped integrator 52a. The light emerging from said exit plane is condensed by a lens 53a to form a secondary light source on a plane 55.

On the other hand, in a state in which the deflecting prism 40 has rotated by 180° from the state shown in FIG. 4, the light beam deflected by said prism 40 is directed parallel to the optical axis of the illuminating optical system by means of the other deflecting prism 42b, and is condensed by the condensing lens 51b to the vicinity of the entrance face of the other rod-shaped integrator 52b, thereby entering the interior thereof. After repeated reflections, the light beam uniformly illuminates the exit face of said integrator 52b, and the light from said exit face is condensed by the lens 53b to form a secondary light source on the plane 55. Thus, on said plane 55, there are formed substantially separated two secondary light sources, which are substantially equivalent to the secondary light sources formed on the exit faces of the fly's eye lenses 41a, 41b in FIG. 1.

Figure 5:
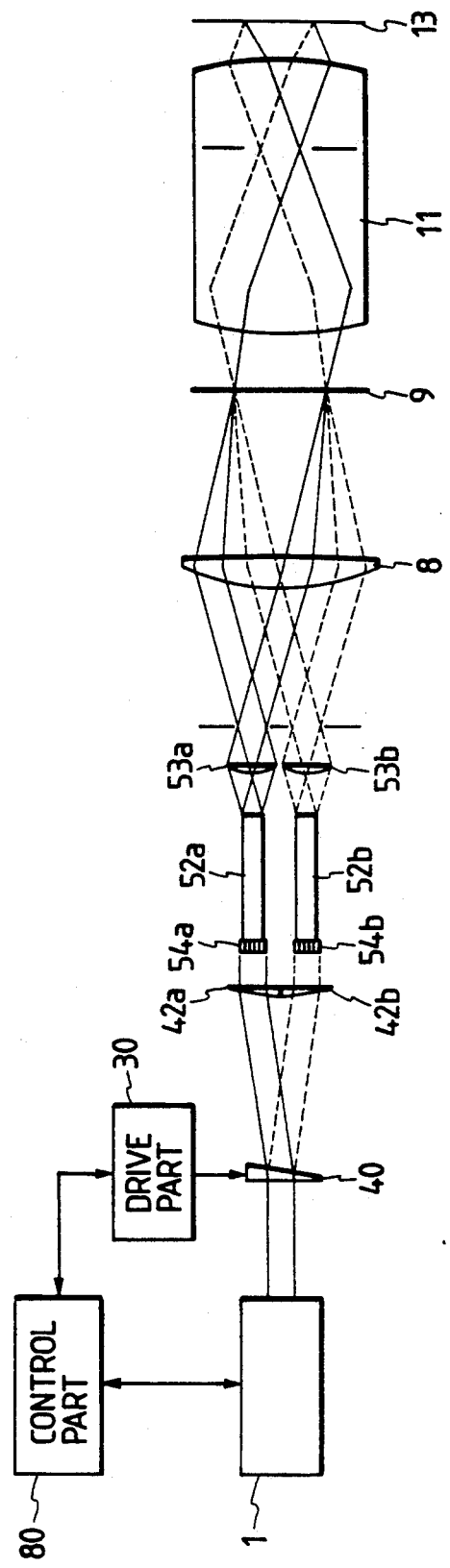
FIG. 5 is a schematic view of a variation of the embodiment shown in FIG. 4.

FIG. 5 illustrates an embodiment in which the condensing lenses 51a, 51b in FIG. 4 are respectively replaced by fly's eye lenses 54a, 54b. The light beam emerging from the deflecting prism 42a or 42b respectively enters the rod-shaped integrator 52a or 52b through the fly's eye lens 54a or 54b. This configuration has an advantage of improving the illumination uniformity of the reticle 9.

Figure 6:
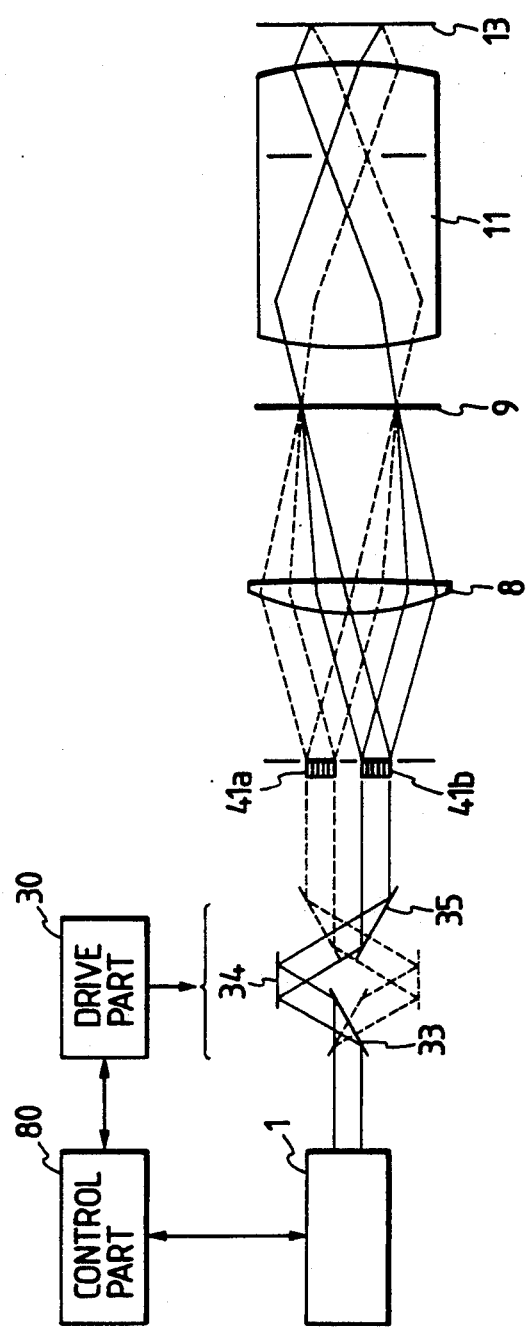
FIG. 6 is a schematic view of an embodiment employing plural mirrors as the deviation means.

FIG. 6 illustrates an embodiment in which the deflecting prisms 40, 42a, 42c in FIG. 1 are replaced by three mirrors 33-35. In this embodiment, the laser beam from the light source 1 is in succession reflected by a first mirror 33, a second mirror 34 and a third mirror 35 and then enters the fly's eye lens 41a or 41b. Said mirrors 33-35 are integrally rotated, about the optical axis of the illuminating optical system, by a driving unit 30. Thus the entering position of the laser beam into the fly's eye lenses is altered by the integral rotation of three mirrors 33-35 about the optical axis, so that the function is basically identical with the configuration with the rotation of the deflecting prism. However the configuration shown in FIG. 6 is advantageous in case the symmetry of the cross section of the laser beam is poor, since the revolution of the laser beam is double of that of the mirrors in case the laser beam is reflected by an odd number of times.

FIGS. 7A and 7B illustrate an embodiment in which the deflecting means is composed of a fixed mirror 31 and a movable mirror 32. Said movable mirror 32 is rotated about an end thereof, by means of a driving unit 30, thereby being selectively positioned in and out of the optical path of the illuminating optical system. More specifically, in a state shown in FIG. 7A, the movable mirror 32 is positioned outside the optical path of the light beam from the light source 1, so that the laser beam therefrom directly enters the fly's eye lens 41b. In a state shown in FIG. 7B, the movable mirror 32 is positioned inside the optical path of the light beam from the light source 1, whereby the laser beam therefrom is reflected by the mirrors 32 and 31 and enters the fly's eye lens 41a. Consequently the laser beam can be alternately introduced into the fly's eye lenses 41a, 41b, by controlling the pulsed light emissions of the light source 1 according to the rotating cycles of the movable mirror 32. Thus said mirror 31 and movable mirror 32 can be regarded as an example of the deflecting means. The function of the movable mirror 32 for selectively introducing the laser beam from the light source 1 into the fly's eye lens 41a or 41b need not be caused by rotation, but may also be attained by vibration.

Figure 14:
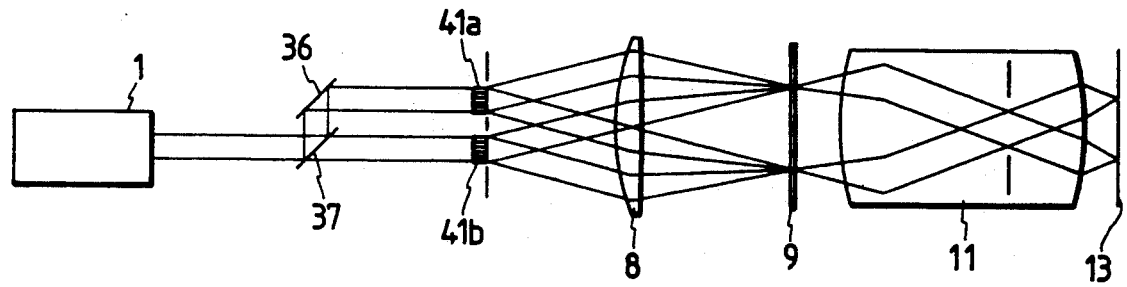
FIG. 14 is a view showing a reference example to be compared with the present invention.
Figure 15:
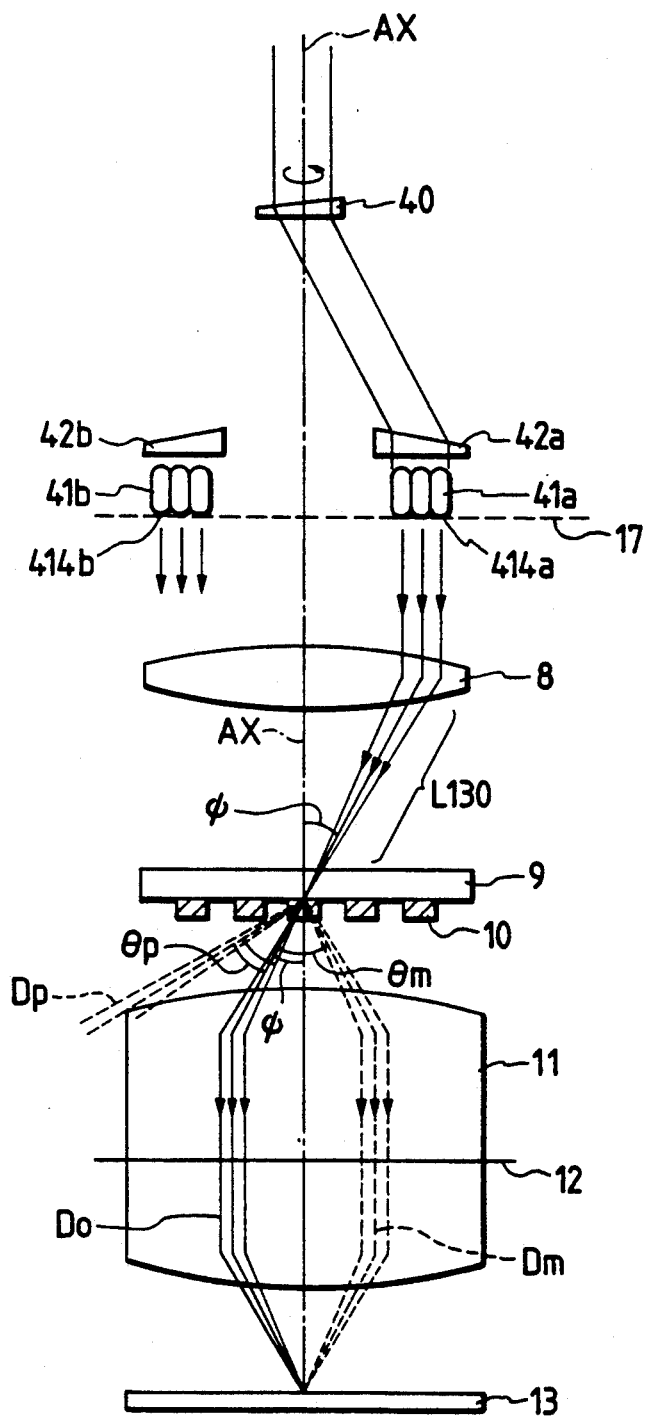
FIG. 15 is a view of the optical system for explaining the principle of the present invention.
Figure 16:
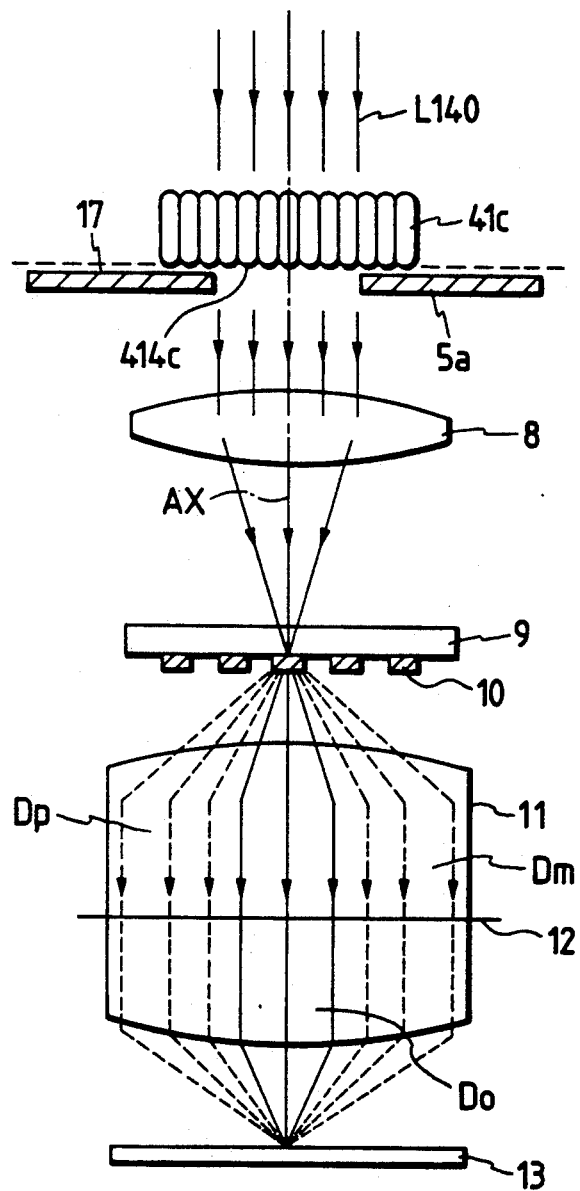
FIG. 16 is a view of the optical system for explaining the principle of the conventional projection exposure apparatus.

However, it is not preferable to replace the movable mirror 32, shown in FIGS. 7A and 7B, with half mirrors 36, 37 in FIG. 14 for splitting the light beam from the light source 1, because the illuminating light beams emerging from the fly's eye lenses 41a, 41b are mutually coherent and may detrimentally affect the imaging on the wafer 13.

In the following there will be explained how to optimize the above-explained illuminating optical system, according to the reticle pattern to be exposed. The positions of the mutually separate plural secondary light sources in a plane perpendicular to the optical axis are preferably determined or modified according to the reticle pattern to be transferred. This can be achieved by determining the incident positions (incident angle $\psi$) to the reticle pattern in such a manner that, as already explained before, the illuminating light beam from each secondary light source attains the optimum resolution and the increase in the depth of focus, in relation to the pitch of the pattern to be transferred.

Figure 11:
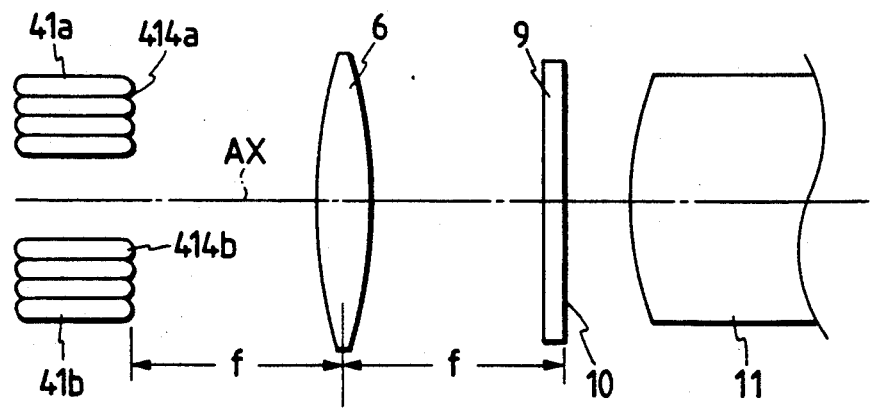
FIG. 11 is a view showing the principal part of the illuminating light source including fly's eye lenses and constituting an embodiment of the present invention.

In the following there will be explained specific examples of determination of the positions of the secondary light sources, with references to FIGS. 11, 12A, 12B, 13A and 13B. FIG. 11 schematically illustrate a portion from the fly's eye lenses 41a, 41b to the reticle pattern 10, wherein focal planes 414a, 414b of the fly's eye lenses 41a, 41b at the reticle side coincide with the Fourrier transformation plane 17 of the reticle pattern 10. Also a lens or a lens group maintaining the Fourrier transforming relation between said focal planes and the reticle pattern is represented by a single lens 6. Also it is assumed that the distance from the principal point of said lens 6 at the side of the fly's eye lenses to the focal planes 414a, 414b of the fly's eye lenses 41a, 41b at the reticle side, and the distance from the principal point of the lens 6 at the reticle side to the reticle pattern 10 are both f.

Figure 12A:
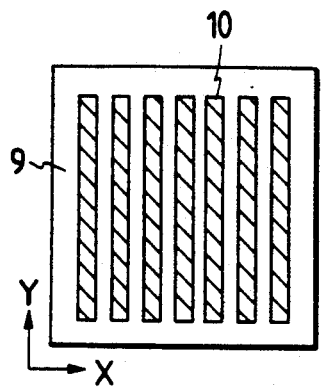
FIGS. 12A and 12B are views for explaining the principle of the present invention when the pattern on the mask is a line-and-space pattern.
Figure 12B:
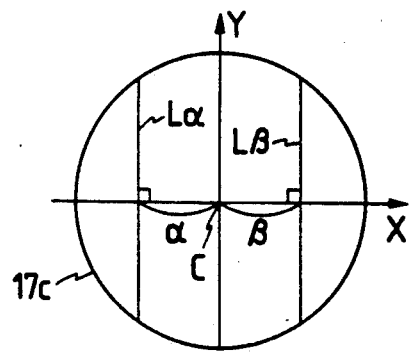
Figure 13A:
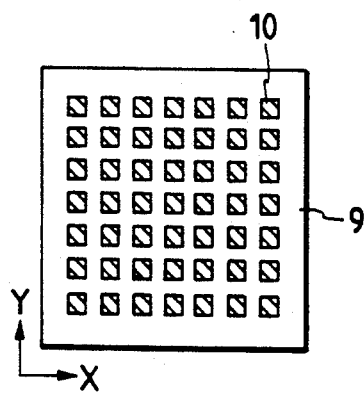
FIGS. 13A and 13B are views for explaining the principle of the present invention when the pattern on the mask is an isolated pattern.
Figure 13B:
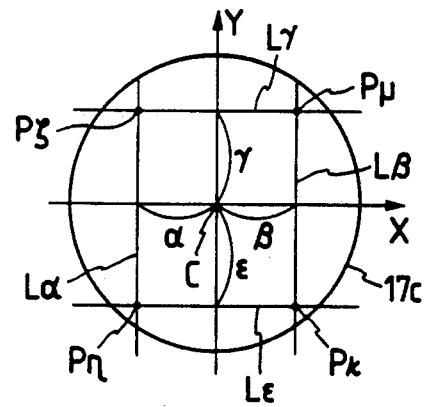

FIGS. 12A and 13A illustrate partial patterns in the reticle pattern 10. FIG. 12B shows the optimum position of the center of the fly's eye lens on the Fourrier transformation plane 17 (pupil plane of the projection optical system) in case of the reticle pattern shown in FIG. 12A, and FIG. 13B shows the optimum positions of the fly's eye lenses (optimum central positions of the fly's eye lenses, or the centers of the secondary light sources) for the reticle pattern shown in FIG. 13A.

FIG. 12A shows so-called one-dimensional line-and-space pattern in which transparent and opaque areas of a same width, extending in stripes in the Y-direction, are regularly arranged with a pitch P in the X-direction. In this case, the optimum position for each fly's eye lens may be arbitrarily selected on lines $L\alpha$ and $L\beta$ defined on the Fourrier transformation plane as shown in FIG. 12B, which shows said Fourrier transformation plane for the reticle pattern 10, seen in the direction of optical axis AX. The X, Y-coordinate system in the plane 17 is selected same as in FIG. 12A showing the reticle pattern 10 seen in the same direction.

Referring to FIG. 12B, the distances $\alpha$ and $\beta$ of the lines $L\alpha$ and $L\beta$ from the center C where the optical axis AX is positioned are mutually equal and are also equal to $\alpha=\beta=f.(\frac{1}{2}).(\lambda/P)$ wherein $\lambda$ is the exposing wavelength. By replacing said distances $\alpha$, $\beta$ by $f.\sin\psi$, there can be obtained a relation $\sin\psi=\lambda/2P$, same as the relation already explained in the foregoing description of the functions. Consequently, if the center of each fly's eye lens (or the center of gravity of light amount distribution of the secondary light source formed by each fly's eye lens) is positioned on the line $L\alpha$ or $L\beta$, with respect to the line-and-space pattern as shown in FIG. 12A, the 0th-order diffracted light and either of the ±1st-order diffracted lights, generated by the illuminating light beam from each fly's eye lens, pass positions of almost equal distances from the optical axis AX, on the pupil plane 12. It is therefore rendered possible, as explained before, to maximize the depth of focus for the line-and-space pattern as shown in FIG. 12A, with a high resolution.

FIG. 13A shows a reticle pattern consisting of so-called isolated space pattern, with pitches Px, Py respectively in the X (horizontal) and Y (vertical) directions. FIG. 13B shows the optimum position of each fly's eye lens, with positional and rotational relation to FIG. 13A same as in FIGS. 12A and 12B. When the illuminating light enters a two-dimensional pattern as shown in FIG. 13A, the diffracted lights are generated in two-dimensional directions, according to the two-dimensional periodicity (Px, Py) of said pattern. Also for the two-dimensional pattern shown in FIG. 13A, the depth of focus can be maximized by positioning the 0th-order diffracted light and either of the 1st-order diffracted lights at substantially equal distances from the optical axis AX on the pupil plane 12 of the projection optical system. In case of the pattern shown in FIG. 13A with a pitch Px in the X-direction, the depth of focus can be maximized in the X-components of the pattern by positioning the center of each fly's eye lens on a line $L\alpha$ or $L\beta$ satisfying a relation $\alpha=\beta=f.(\frac{1}{2}).(\lambda/Px)$ as shown in FIG. 13B. Similarly the depth of focus can be maximized for the Y-components of the pattern by positioning the center of each fly's eye lens on a line $L\gamma$ or $L\epsilon$ satisfying a relation $r=\epsilon=f.(\frac{1}{2}).(\lambda/Py)$.

When the illuminating light beam from a fly's eye lens in a position shown in FIG. 12B or 13B enters the reticle pattern 10, the 0th-order diffracted light $D_0$ and either one of the +1st-order diffracted light $D_r$ or the −1st-order diffracted light $D_m$ pass positions of approximately same distances from the optical axis AX on the pupil plane 12 of the projection optical system 11. Consequently as already explained before, there can be realized a projection exposure apparatus of a high resolution and a large depth of focus.

In the foregoing, there have only been considered two examples shown in FIGS. 12A and 13A as the reticle pattern, but, also for other patterns, there can be considered the periodicity thereof and the centers of the fly's eye lenses can be so positioned that either of the +1st-order and −1st-order diffracted lights and the 0th-order diffracted light from said pattern pass the positions of almost same distances from the optical axis AX on the pupil plane 12 of the projection optical system. In the patterns shown in FIGS. 12A and 13A, the ±1st-order diffracted light components become stronger in the various diffracted components because the duty ratio of the lines and the spaces is 1:1. For this reason consideration has been given to the positional relationship between either of the ±1st-order diffracted lights and 0th-order diffracted light. However, if the duty ratio of the pattern is different from 1:1, consideration may be so given that another diffracted light, for example one of the ±2nd-order diffracted lights and the 0th-order diffracted light are positioned at approximate same distances from the optical axis AX on the pupil plane 12.

Also in case the reticle pattern 10 contains a two-dimensionally periodic pattern as shown in FIG. 13B, and if a particular 0th-order diffracted light component is considered, there can exist 1st- or higher-order diffracted light components distributing in a first (X) direction, and 1st- or higher-order diffracted light components distributing in the second (Y) direction, around said 0th-order diffracted light component, on the pupil plane 12 of the projection optical system. Therefore, for obtaining satisfactory two-dimensional image with respect to said particularly 0th-order diffracted light component, the position of the particular 0th-order diffracted light component (position of a fly's eye lens) should be so regulated that one of the higher-order diffracted components in the first direction, one of the higher-order diffracted components in the second direction, and the particular 0th-order diffracted component are distributed at approximate same distances from the optical axis AX on the pupil plane 12. As an example, in FIG. 13B, the central position of the fly's eye lens should be selected at P$\zeta$, P$\eta$, P$\kappa$ or P$\mu$. Since these points are on the line L$\alpha$ or L$\beta$ representing optimum positions for the periodicity in the X-direction, they constitute optimum light source position for both patterns in the X- and Y-directions.

In the foregoing description, the two-dimensional pattern is assumed to have two-dimensional directional property in a same position on the reticle, but the above-mentioned method is applicable also in case the reticle pattern contains, in different positions, plural patterns with directional properties in different directions.

Also in case the reticle pattern contains plural directional properties and plural pitches, determined corresponding to each directional property and pitch of the pattern as explained above, but the fly's eye lenses may be placed at the average positions of such optimum positions. Also said average position may be determined with weighting according to the pitch and importance of the pattern.

The 0th-order diffracted light component emerging from each fly's eye lens is inclined with respect to the wafer. Unless the center of gravity of the light amount of such inclined incident light beams is perpendicular to the wafer, there will result a drawback that the position of the transferred image is shifted along the wafer plane, in case of a small defocus of the wafer 13. In order to prevent such phenomenon, the direction of the center of gravity of the light amount of the illuminating light beams from the fly's eye lenses on the focal plane or in the vicinity thereof is made perpendicular to the wafer, or parallel to the optical axis AX.

Stated differently, when an optical axis (central line) is considered in each fly's eye lens, the fly's eye lenses should be so positioned that the sum of the vectors, each obtained as the product of the position vector of said optical axis (central line) in the Fourier transformation plane, with respect to the optical axis AX of the projection optical system 11 and the light amount emerging from each fly's eye lens, becomes equal to zero.

In a simpler method, there may be employed 2m fly's eye lenses (m being a natural number), among which m lenses are positioned according to the above-mentioned optimizing method shown in FIGS. 12A, 12B, 13A and 13B, and remaining m lenses can be positioned symmetrically to the first-mentioned m lenses with respect to the optical axis AX.

In the foregoing embodiments, the cross-sectional shape of each lens element constituting the fly's eye lens is preferably rectangular, since the circuit pattern area of the reticle is usually rectangular. Since the entrance face of the fly's eye lens is conjugate with the pattern bearing face of the reticle, the rectangular reticle pattern are alone can be efficiently illuminated if the entrance face of each lens element is also rectangular.

Also the size of each secondary light source is preferably such that the numerical aperture per each emerging light beam (half angle on the reticle) is about 0.1 to 0.3 times of the numerical aperture of the projection optical system at the reticle side. This is because the fidelity of the transferred pattern (image) is deteriorated below 0.1 times, while the effect of obtaining a high resolution and a large depth of focus becomes inconspicuous above 0.3 times.

In the apparatus embodying the present invention, the planar light source forming means may be composed of rod-shaped integrator, equivalent to the fly's eye lens, as shown in FIG. 3, 4 or 5.

Also in the foregoing embodiments, the light beam is introduced into different positions by the rotation of a deflecting prism or a mirror, but it is also possible to deflect the light from the light source to both sides of the optical axis of the illuminating optical system, for example by vibration of a parallel-faced flat plate positioned in front of the light source.

As explained above, the present invention is not limited to the foregoing embodiments but is subject to various modifications within the scope and spirit of the appended claims.

What is claimed is:

1. A projection exposure apparatus comprising:
   an illuminating optical system for illuminating a mask bearing a predetermined pattern; and
   a projection optical system for forming the image of said pattern, illuminated by said illuminating optical system, onto a photosensitive substrate;
   wherein said illuminating optical system includes:
   light source means for generating pulsed light;
   surface light source forming means for forming a surface light source by the pulsed light from said light source means;
   a condensing optical system for condensing the light from said surface light source forming means thereby illuminating said mask; and
   deviation means positioned in an optical path between said light source means and said surface light source forming means and adapted to deviate the pulsed light from said light source means;
   wherein said deviation means is adapted to introduce said pulsed light, by every pulse or by every plural number of pulses, into plural positions of said surface light source forming means, deviated from the optical axis of said illuminating optical system; and
   wherein said surface light source forming means is adapted to form plural surface light sources which are substantially separated each other and are deviated from said optical axis.

2. A projection exposure apparatus according to claim 1, further comprising control means;
   wherein said deviation means includes a deviating optical element for deviating the light, and drive means for driving said deviating optical element; and
   said control means is adapted to control said drive means in such a manner that said pulsed from said deviating optical element enters, by every pulse or by every plural number of pulses, plural positions of said surface light source forming means, deviated from said optical axis.

3. A projection exposure apparatus according to claim 1, further comprising control means for controlling the light source means;

wherein said deviation means includes a deviating optical element for deviating the light, and drive means for driving said deviating optical element; and said control means is adapted to control said light source means in such a manner that the pulsed light from said deviating optical element enters, by every pulse or by every plural number of pulses, plural positions of said surface light source forming means, deviated from said optical axis.

4. A projection exposure apparatus according to claim 1, wherein said surface light source forming means includes plural lens elements.

5. A projection exposure apparatus according to claim 1, wherein said surface light source forming means includes a rod-shaped optical element.

6. A projection exposure apparatus according to claim 1, wherein said surface light source forming means includes plural optical integrators provided in positions deviated from the optical axis of said illuminating optical system.

7. A projection exposure apparatus according to claim 6, further comprising control means;

wherein said deviation means includes a deviating optical element for deviating the light, and drive means for driving said deviating optical element; and said control means is adapted to control said drive means according to the cycle time of the pulsed light emitted by said light source means, in such a manner that the pulsed light from said deviating optical element enters said plural optical integrators in succession, for every pulse or every plural number of pulses.

8. A projection exposure apparatus according to claim 6, further comprising control means for controlling said light source means;

wherein said deviation means includes a deviating optical element for deviating the light, and drive means for driving said deviating optical element; and said control means is adapted to control the pulse emitting cycle of said light source means in such a manner that the light from said deflecting optical element enters said plural optical integrators in succession, for every pulse or for every plural number of pulses.

9. A projection exposure apparatus according to claim 6, wherein said optical integrator includes plural lens elements.

10. A projection exposure apparatus according to claim 6, wherein said optical integrator includes a rod-shaped optical element.

11. A projection exposure apparatus according to claim 7;

wherein said deviating control element includes plural wedge-shaped optical elements; and said drive means is adapted to drive at least one of said plural wedge-shaped optical elements.

12. A projection exposure apparatus according to claim 7;

wherein said deviating optical element includes plural reflecting faces; and said drive means is adapted to drive at least one of said plural reflecting faces.

* * * * *